(12) United States Patent
Swaminathan et al.

(10) Patent No.: US 7,504,706 B2
(45) Date of Patent: Mar. 17, 2009

(54) PACKAGING HAVING AN ARRAY OF EMBEDDED CAPACITORS FOR POWER DELIVERY AND DECOUPLING IN THE MID-FREQUENCY RANGE AND METHODS OF FORMING THEREOF

(75) Inventors: Madhavan Swaminathan, Marrietta, GA (US); Ege Engin, Atlanta, GA (US); Lixi Wan, Tucker, GA (US); Prathap Muthana, Atlanta, GA (US)

(73) Assignee: E. I. Du Pont De Nemours, Wilmington, DE (US)

( * ) Notice: Subject to any disclaimer, the term of this patent is extended or adjusted under 35 U.S.C. 154(b) by 0 days.

(21) Appl. No.: 11/514,097

(22) Filed: Aug. 31, 2006

(65) Prior Publication Data

US 2007/0120225 A1 May 31, 2007

Related U.S. Application Data

(60) Provisional application No. 60/729,273, filed on Oct. 21, 2005.

(51) Int. Cl.
*H01L 29/00* (2006.01)
(52) U.S. Cl. .................. 257/532; 257/535; 257/904; 257/924
(58) Field of Classification Search ............ 257/532, 257/535, 904, 924
See application file for complete search history.

(56) References Cited

U.S. PATENT DOCUMENTS

| | | | |
|---|---|---|---|
| 5,010,641 A | | 4/1991 | Sisler |
| 5,027,253 A * | | 6/1991 | Lauffer et al. ............ 361/321.4 |
| 5,079,069 A | | 1/1992 | Howard et al. |
| 5,155,655 A | | 10/1992 | Howard et al. |
| 5,161,086 A | | 11/1992 | Howard et al. |
| 5,162,977 A | | 11/1992 | Paurus et al. |
| 5,200,810 A * | | 4/1993 | Wojnarowski et al. ...... 361/750 |
| 5,428,499 A | | 6/1995 | Szerlip et al. |
| 5,469,324 A | | 11/1995 | Henderson et al. |
| 5,504,993 A | | 4/1996 | Szerlip et al. |
| 5,506,754 A * | | 4/1996 | Brooks et al. ............. 361/719 |
| 5,870,274 A | | 2/1999 | Lucas |
| 6,214,445 B1 | | 4/2001 | Kanbe et al. |
| 6,215,372 B1 | | 4/2001 | Novak |
| 6,252,761 B1 * | | 6/2001 | Branchevsky ............ 361/321.2 |

(Continued)

OTHER PUBLICATIONS

U.S. Appl. No. 10/801,326, filed Mar. 16, 2004, Borland et al.

(Continued)

*Primary Examiner*—Ida M Soward
(74) *Attorney, Agent, or Firm*—Thomas W. Gorman

(57) ABSTRACT

One embodiment of the present invention provides a device for providing a low noise power supply package to an IC in the mid-frequency range of 1 MHz to 3 GHz including installing in said package an array of embedded discrete ceramic capacitors, and optionally planar capacitor layers. A further embodiment provides a device for providing a low noise power supply package to an IC in the mid-frequency range of 1 MHz to 3 GHz including an array of embedded discrete ceramic capacitors with different resonance frequencies, arranged in such a way that the capacitor array's impedance vs frequency curve in the critical mid-frequency range yields impedance values at or below a targeted impedance value.

10 Claims, 18 Drawing Sheets

U.S. PATENT DOCUMENTS

| | | |
|---|---|---|
| 6,317,023 B1 | 11/2001 | Felten |
| 6,346,743 B1 * | 2/2002 | Figueroa et al. ............. 257/723 |
| 6,407,929 B1 | 6/2002 | Hale et al. |
| 6,611,419 B1 | 8/2003 | Chakravorty |
| 6,694,583 B2 * | 2/2004 | Branchevsky .............. 29/25.42 |
| 6,778,058 B1 * | 8/2004 | Branchevsky ............... 336/200 |
| 7,307,829 B1 * | 12/2007 | Devoe et al. ................ 361/328 |
| 2001/0010398 A1 * | 8/2001 | Farooq et al. ............... 257/724 |
| 2002/0054471 A1 | 5/2002 | Adae-Amoakoh et al. |
| 2002/0134581 A1 | 9/2002 | Figueroa et al. |
| 2004/0023361 A1 | 2/2004 | Gaier et al. |
| 2004/0099999 A1 | 5/2004 | Borland |
| 2004/0233611 A1 | 11/2004 | Borland |
| 2006/0133057 A1 * | 6/2006 | McGregor et al. .......... 361/763 |
| 2006/0145331 A1 * | 7/2006 | Cho et al. ................... 257/700 |

OTHER PUBLICATIONS

U.S. Appl. No. 10/801,257, filed Mar. 16, 2004, Borland et al.

* cited by examiner

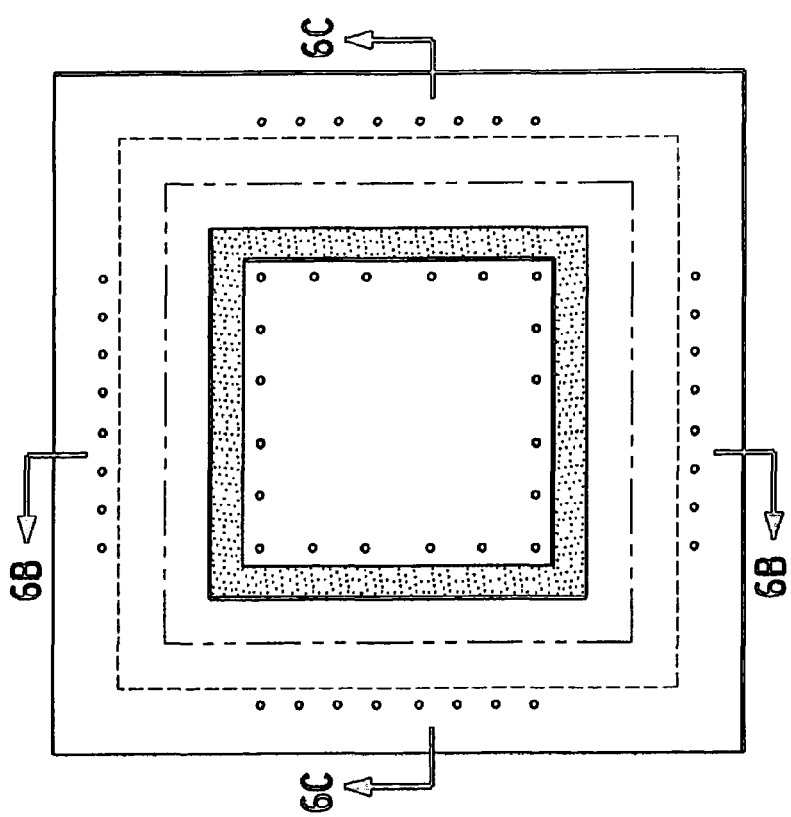

Capacitor Parameters without Vias

| | Type | Capacitance | ESR (Resistance) | ESL Inductance |
|---|---|---|---|---|
| Capacitor 1 | A | 1.26nF | 36 mohms | 48pH |
| Capacitor 2 | B | 1.17nF | 50 mohms | 47.3pH |
| Capacitor 3 | C | 1.63nF | 34 mohms | 41.6pH |
| Capacitor 4 | A | 5.15nF | 8 mohms | 33.7pH |
| Capacitor 5 | B | 5.16nF | 10.7 mohms | 35.07pH |
| Capacitor 6 | C | 6.16nF | 10.7 mohms | 35.48pH |
| Capacitor 9 | A | 10.6nF | 7.9 mohms | 35.44pH |
| Capacitor 8 | B | 11nF | 10 mohms | 40pH |
| Capacitor 7 | C | 13.6nF | 8.9 mohms | 33.8pH |

1 mm (rows 1–3), 2 mm (rows 4–6), 3 mm (rows 7–9)

Type A    Type B    Type C

Capacitor Parameters with Vias

| | Type | Capacitance | ESR (Resistance) | ESL Inductance |
|---|---|---|---|---|
| 1 mm | A | Capacitor 1 | 1.05nF | 89 mohms | 382pH |
| | B | Capacitor 2 | 1.20nF | 86.5 mohms | 125pH |
| | C | Capacitor 3 | 1.7nF | 37.1 mohms | 74.6pH |
| 2 mm | A | Capacitor 4 | 6.49nF | 50.1 mohms | 308pH |
| | B | Capacitor 5 | 5.28nF | 128 mohms | 120.5pH |
| | C | Capacitor 6 | 6.6nF | 20.9 mohms | 65.17pH |
| 3 mm | A | Capacitor 9 | 15.3nF | 100 mohms | 218.2pH |
| | B | Capacitor 8 | 13.26nF | 15.4 mohms | 115pH |
| | C | Capacitor 7 | 13.2nF | 17.3 mohms | 79.39pH |

Type A    Type B    Type C

Capacitor-3

|  | Capacitance | Resistance | Inductance |
|---|---|---|---|
| Without Vias | 1.63nF | 34 mohms | 41.6pH |
| With Vias | 1.7nF | 37.1mohm | 74.6pH |

Capacitor 7-3mm x 3mm

PACKAGING HAVING AN ARRAY OF EMBEDDED CAPACITORS FOR POWER DELIVERY AND DECOUPLING IN THE MID-FREQUENCY RANGE AND METHODS OF FORMING THEREOF

FIELD OF THE INVENTION

The present invention relates to the design, layout and structure of an electronic integrated circuit (IC) package that demonstrates the ability to provide clean power delivery through the use of an array of embedded capacitor layers.

TECHNICAL BACKGROUND

The present invention concerns the field of decoupling capacitors. Decoupling capacitors on IC packages are often essential to reduce voltage fluctuations, supply charge and maintain integrity of power distribution. Surface Mount Technology (SMT) decoupling capacitors fail to provide decoupling above several hundred megahertz due to their high lead inductance. On-chip capacitors are effective only at gigahertz frequencies due to their low capacitance. As a result of these limits, there is a frequency range, designated as the mid-frequency range, which cannot be sufficiently decoupled using current technologies.

The present invention provides a solution for charge supply (power delivery) and the decoupling of IC's at the package level. It overcomes the certain inductance problems of the board decoupling methodologies and saves real estate on the chip by reducing the size of the required on-chip capacitance, thereby improving the performance of digital and mixed-signal systems by reducing the power supply noise and providing sufficient current to meet semiconductor switching speed requirements, particularly high current Input/output (I/O) drivers, at a low cost. The present inventors have provided capacitors and packages which can meet these mid-range frequency levels.

SUMMARY OF THE INVENTION

One embodiment of the present invention provides a device for providing a low noise power supply package to an IC in the mid-frequency range of 1 MHz to 3 GHz comprising installing in said package an array of embedded discrete ceramic capacitors, and optionally planar capacitor layers. A further embodiment provides a device for providing a low noise power supply package to an IC in the mid-frequency range of 1 MHz to 3 GHz comprising using an array of embedded discrete ceramic capacitors with different resonance frequencies, arranged in such a way that the capacitor array's impedance vs frequency curve in the critical mid-frequency range yields impedance values at or below a targeted impedance value.

Still a further embodiment provides a method for designing optimized capacitor arrays comprising the following steps: (a) building test structures that include different capacitor designs, sizes, via interconnects and interconnections; (b) measuring their individual capacitance, resistance, and inductance values and impedance vs frequency responses; and (c) modeling composite impedance vs frequency response for a variety of capacitor arrays to meet a mid-frequency impedance target; and (d) fabricate and test a structure based on the modeling results. The present invention also provides for an optimized capacitor array formed by the method above and a device comprising the optimized capacitor array.

BRIEF DESCRIPTION OF THE FIGURES

FIGS. 6A-6C describeé a capacitor Type C.

DETAILED DESCRIPTION OF THE INVENTION

The focus of this invention is on the use of embedded capacitor arrays in the structure of an electronic IC package, which addresses the mid-frequency range so as to provide sufficient charge supply and a clean power delivery package. The embedded capacitor arrays are formed by using thin dielectrics with high dielectric constant within the layer stack-up of the package.

One embodiment of the present invention provides a device for providing a low noise power supply package to an IC in the mid-frequency range of about 1 MHz to 3 GHz comprising installing in said package an array of embedded discrete ceramic capacitors, and optionally planar capacitor layers.

A further embodiment of the invention uses embedded capacitor arrays, which address the mid-frequency range, so as to provide a clean power delivery package. The embedded capacitor arrays are formed by using thin dielectrics with high dielectric constant within the layer stack-up of the package. The array of discrete embedded capacitors may be connected in parallel or connected individually in other locations and may be made up of capacitors that have different resonance frequencies and be of different sizes and shapes.

Figure 1:
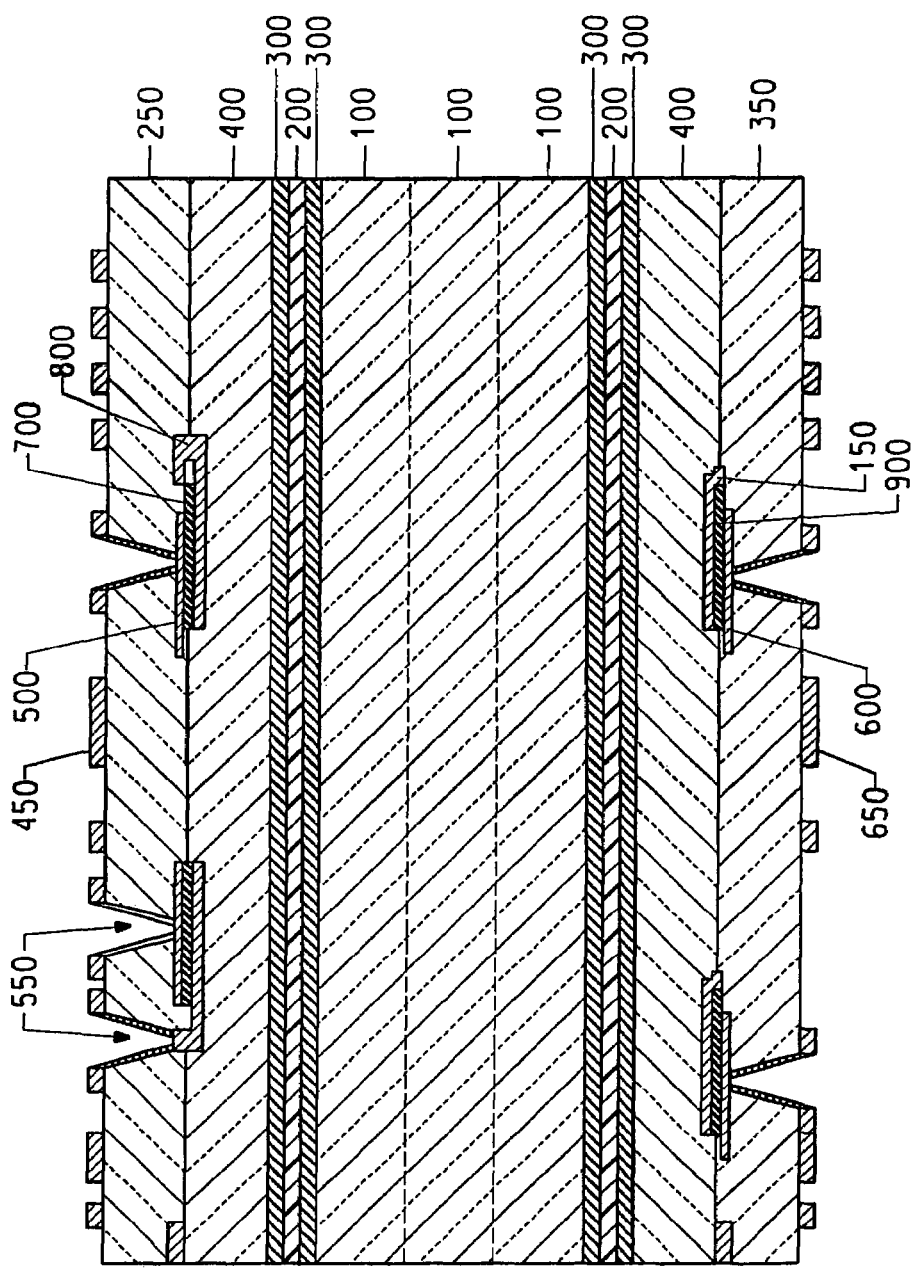
FIG. 1 describes a stackup of a test structure.
Figure 2:
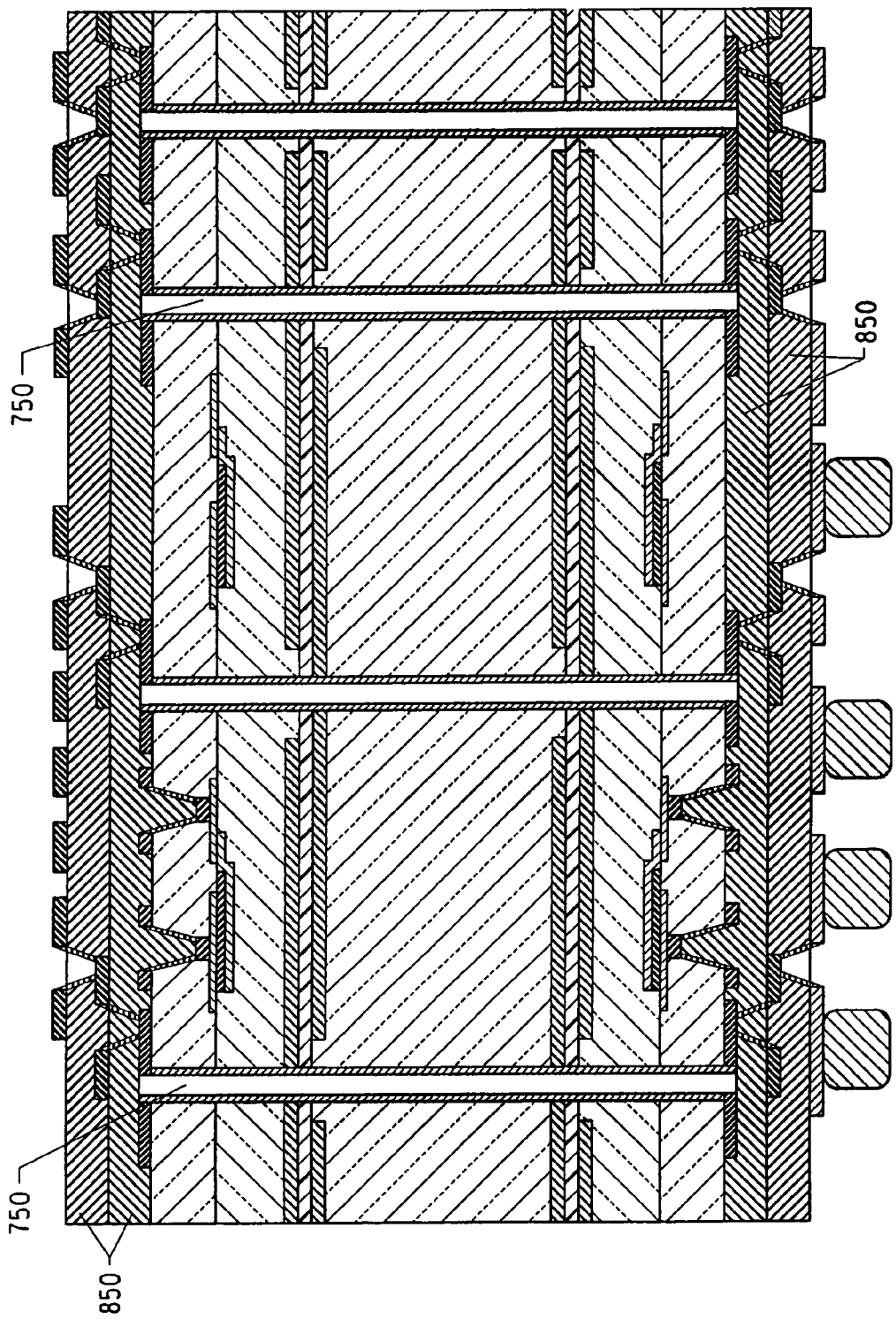
FIG. 2 describes a test vehicle stack-up structure.

FIG. 1 shows a package cross-section with embedded capacitor layers. The discrete capacitor array can be supplemented with continuous planar capacitor layers as shown in FIG. 1. FIG. 2 shows an embedded capacitor array layout in the package. Different sized capacitors constitute this array. An array is defined as a grouping or arrangement of elements, herein. In the present invention, the elements of the array are capacitors, specifically discrete capacitors.

The rationale for using various sized capacitors is that the capacitance, equivilant series resistance (ESR) and equivilant series inductance (ESL) associated with each of them is different, which translates into a different resonant frequency. In the present invention, at least two discrete capacitors are required. For optimal performance, the discrete capacitors should be placed in close proximity to the integrated circuit. The vias that connect the capacitors to the power/ground solder balls of a chip also influence the performance of the array. By proper co-design of the vias and capacitors, the frequency range under consideration can be targeted. In one embodiment, the capacitors are connected in parallel with each other to meet the low target impedance requirement of the input impedance of the power delivery network at the chip level. The number of capacitors required for a particular type of use can be determined from the series resistance of an individual capacitor. The parallel combination of the series resistances should be below the target impedance requirement. The capacitor frequency response is very sensitive to its position in the package.

The discrete capacitors typically range in size from 0.25 to 5 millimeters. In one embodiment, the range is 0.5 to 3 millimeters. However, it is understood by those skilled in the art that any conceivable discrete capacitor size ranges are possible. In one embodiment, at least two discrete capacitors which make-up the array are of varying size.

It is important to be able to place these low ESL capacitors in the "die shadow" of the processor. Placement of these capacitors outside the die shadow is not preferred because it may cause routing problems and change the predicted performance of a capacitor because of the increased inductance and resistance. "Die shadow" is defined herein as area of the package projected under the footprint of the die, as viewed from the top. Typically, there are layers between the discrete capacitor array and the die. In some embodiments, the array of discrete capacitors may lie partially outside of the "die shadow." There is an increase in the power consumption of microprocessors for future technology nodes, accompanied by a decrease in the supply voltage. This results in tighter noise margins for the supply voltage fluctuations. The power delivery network provides the power supply to the IC. If improperly designed this network could be a major source of noise, such as ground bounce affecting the functionality of the IC, and electromagnetic interference. In order to reduce the supply voltage fluctuations, the magnitude of the input impedance of the power delivery network close to the chip has to be kept at a very small value. This low impedance has to be maintained from dc to multiples of the clock frequency. Decoupling capacitors play a very important role in the power delivery network as they also act as charge providers for the switching circuits. They should provide low impedance, dictating a high capacitance, low parasitic inductance, and low parasitic resistance. Whatever technology is used on the board (such as SMT capacitors or buried capacitors on the board), the inductance of the package power supply leads make it ineffective for decoupling in the mid-frequency range. This frequency range cannot be addressed by using on-chip capacitors either, since the amount of on-chip capacitance that can be added is limited to the real estate on-chip. This serves as a limitation for on-chip capacitors at low frequencies. An increase in the amount of on-chip decoupling capacitance will increase the cost and the size of the chip. Embedded capacitor arrays inside the package can provide sufficient decoupling in a bandwidth of several decades, due to their low parasitic inductance and resistance and high capacitance regarding the mid-frequency decoupling. The lower inductance compared with the SMT capacitors on the board is due to their closer position to the chip.

The devices (or packages) of the present invention may be selected from an interposer, printed wiring board, multichip module, area array package, system-on-package, system-in-package, and the like.

EXAMPLES

Fabrication of a test structure containing discrete embedded ceramic capacitors (see FIG. 1).

Three 100 micron thick layers of BT (bismaleimide triazine) prepreg (B-stage resin on glass weave; type GHPL 830HS) from Mitsubishi Gas Chemical [100] were laminated to two planar capacitance laminates (DuPont Interra® HK11, commercially available from E. I. du Pont de Nemours and Company). The Hk11 consisted of 14 µm thick, filled polyimide [200] with 35 µm copper foil on each side [300]. (Note: this test structure was a precursor to a more complex test vehicle (FIG. 2) in which the planar capacitor layers are connected to PTHs (plated throughholes) [750] and additional microvia build-up layers [850] —metal layers M1, M2, M13, and M14, not shown in FIG. 1, are added to the test structure). Discrete ceramic capacitors were formed on two copper foils (metal layers M4 [500] and M10 [600]) as described in U.S. 6,317,023. The foils were 35 µm thick copper, the dielectric composition [700, 900] was DuPont's EP310, commercially available from E. I. du Pont de Nemours and Company (20 µm fired thickness), and the screen printed copper electrode was 5 µm fired thickness copper (metal layers M5 [800] and M11 [150], DuPont's EP320, commercially available from E. I. du Pont de Nemours and Company). The metal foils M4 and M10 were then layed up with 100 µm BT prepreg [400] on either side of the structure containing the two planar capacitor layers and laminated. A multilayer bonding coating was then applied to metal layers M4 and M10. Metal layers M4 and M10 were then structured in a (subtractive) print & etch photo-lithographic process. BT prepreg (100 µm)[250, 350], capped with 3 µm copper foil [450, 650] was then laminated to the structure on both sides (metal layers M3 and M12). Blind vias (microvias, 150 µm diameter) [550] were then drilled with a UV-laser through M3 and M12 and the underlying prepreg layers to connect to metal layers M4 and M10. The microvia holewalls were then prepared by standard swell and (permanganate) etch chemistry, followed by electroless copper deposition. The patterning of metal Layers M3 and M12 and copper build-up in the microvias was accomplished by a semi-additive plating process (apply plating resist pattern, plate 12 µm copper, strip resist, differential etch of base copper).

Figure 3:
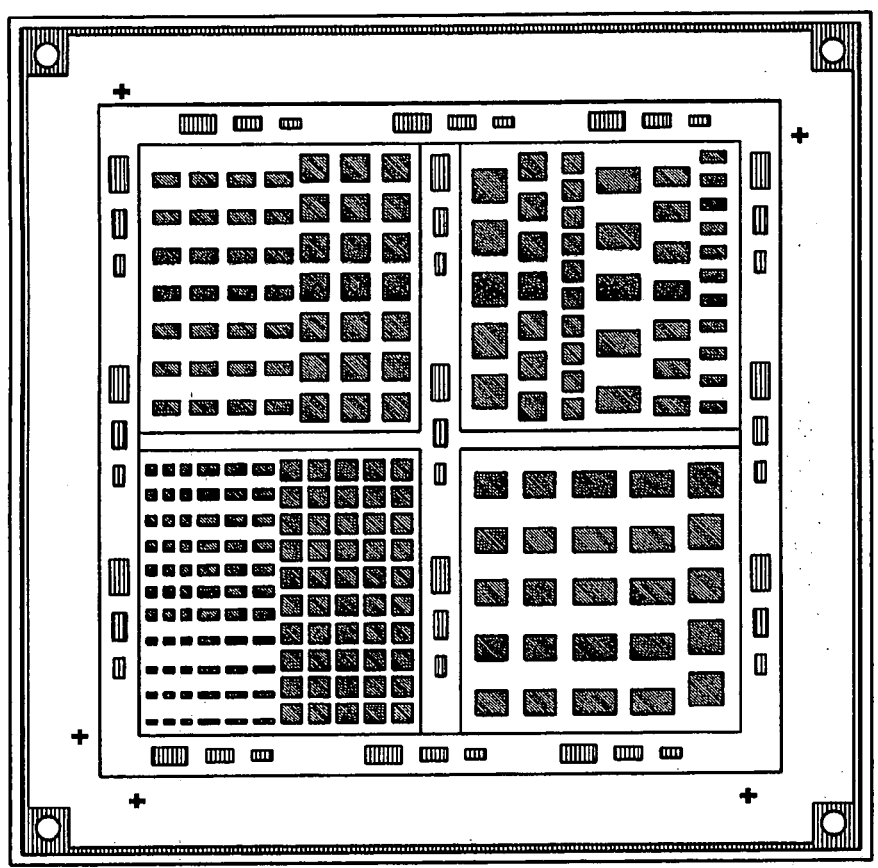
FIG. 3 describes a pattern of capacitors on metal layers [150] and [800].
Figure 4A:
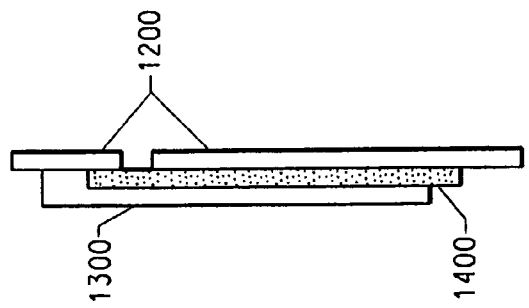
FIGS. 4A-4C describes a capacitor Type A.
Figure 4B:
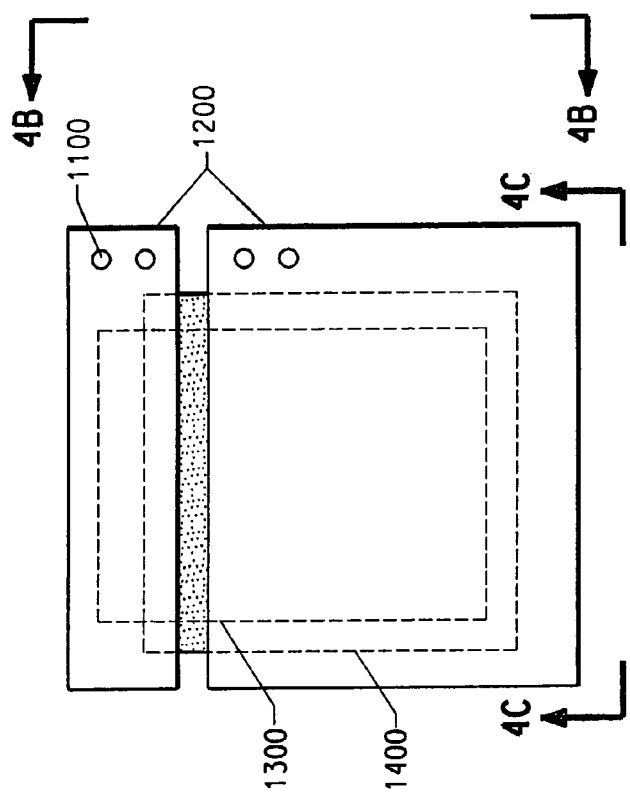
Figure 4C:
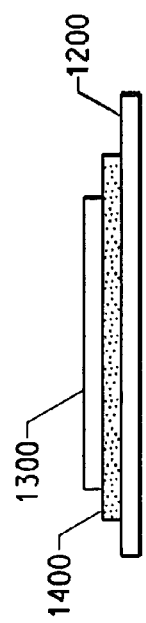
Figures 5A, 5B, 5C:
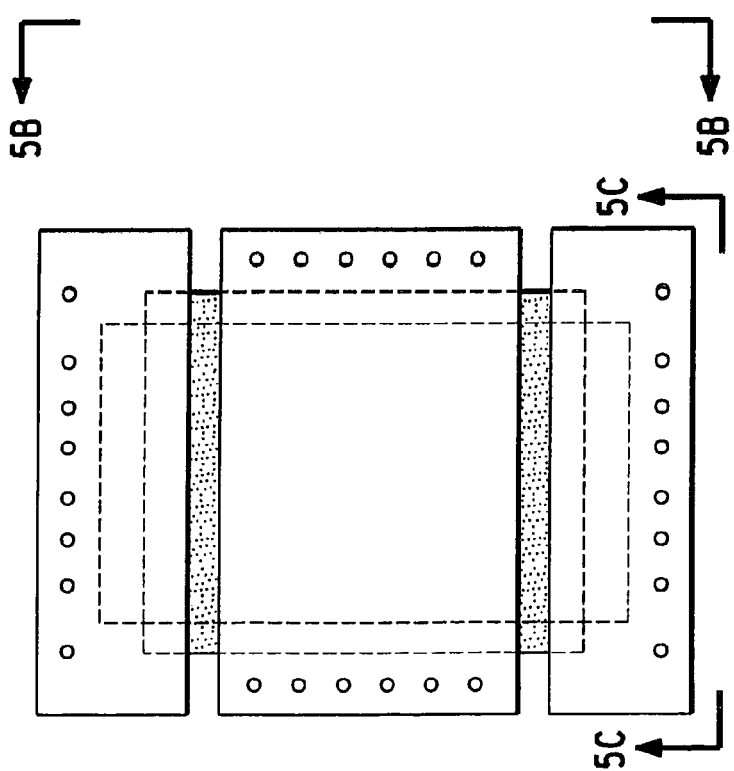
FIGS. 5A-5C describeé a capacitor Type B.

The layout of the embedded capacitors on metal layers M5 and M11 is shown in FIG. 3. There are three different capacitor designs: Type A (FIG. 4), Type B (FIG. 5), and Type C (FIG. 6). For each type, there are capacitors with 1 mm², 4 mm², and 9 mm² effective capacitor size (area). The capacitor designs differ in the relative position and size of the foil electrodes [1200], the dielectric [1400], and the screen printed copper electrode [1300]. They further differ in the design of the clearance (gap) that insulates the two copper electrodes, and they differ in location and number of vias [1100] that connect the embedded capacitor to the next metal layer above. For the 9 mm² size capacitor,Type A design features 4 via connections, Type B has 28 vias, and Type C has 52 vias.

The electrical parameters (capacitance, resistance, inductance) of individual capacitors, with and without via connections, were measured. The impedance vs frequency response for individual capacitors was measured. The measured response curves were compared with the curves generated by the simulation model. The model was then used to simulate the impedance of several capacitor arrays, applying conservative as well as advanced design rules for the embedded capacitor arrays.

Figure 7:
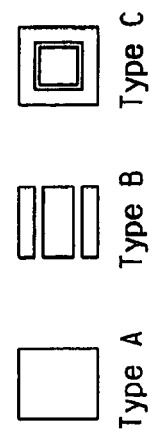
FIG. 7 is a chart showing capacitor parameters without vias.
Figure 8:
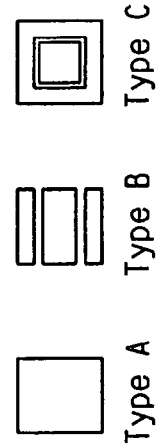
FIG. 8 is a chart showing capacitor parameters with vias.

Results:

FIG. 7 summarizes the capacitance, resistance, and inductance measurements for Type A, B, and C type capacitors of 1, 4, and 9 mm$^2$ size, without via connections. It shows that the capacitance goes up with size, as expected, and does not vary much with the design type. Inductance values of all three types, without via connections, are fairly similar. FIG. 8 shows the same parameters for capacitors of Type A, B, and C with via connections. The data show that capacitor type and the number of vias and their location greatly affects the resistance and inductance of the capacitor.

Figure 9A:
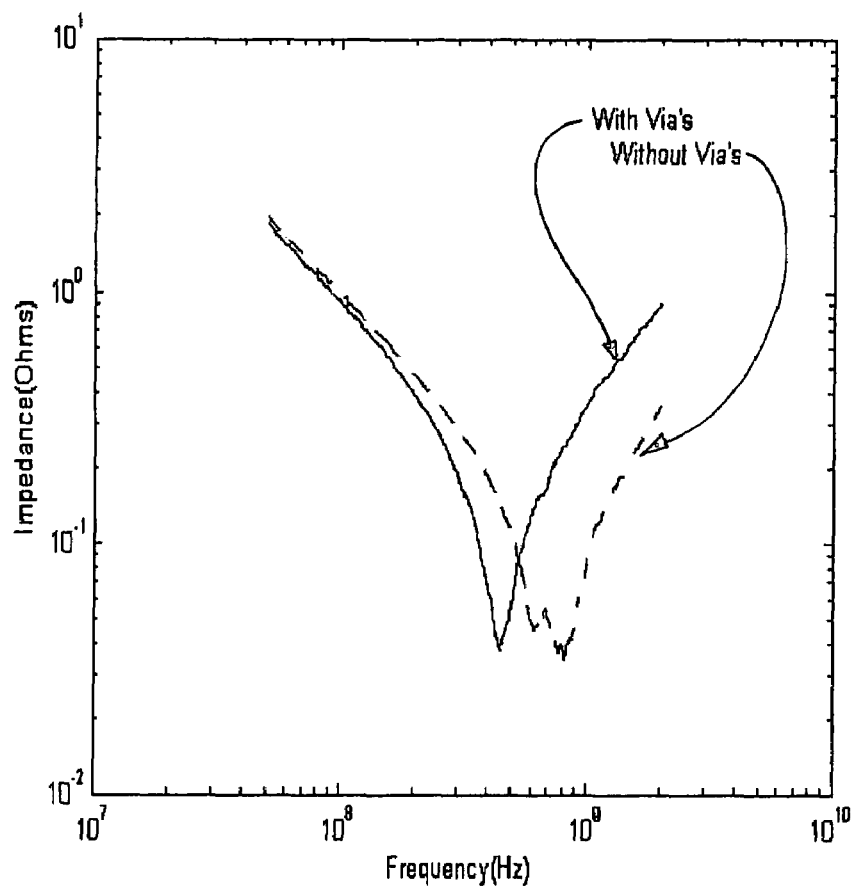
FIGS. 9A and 9B are graphs measurement results with and without vias.
Figure 9B:
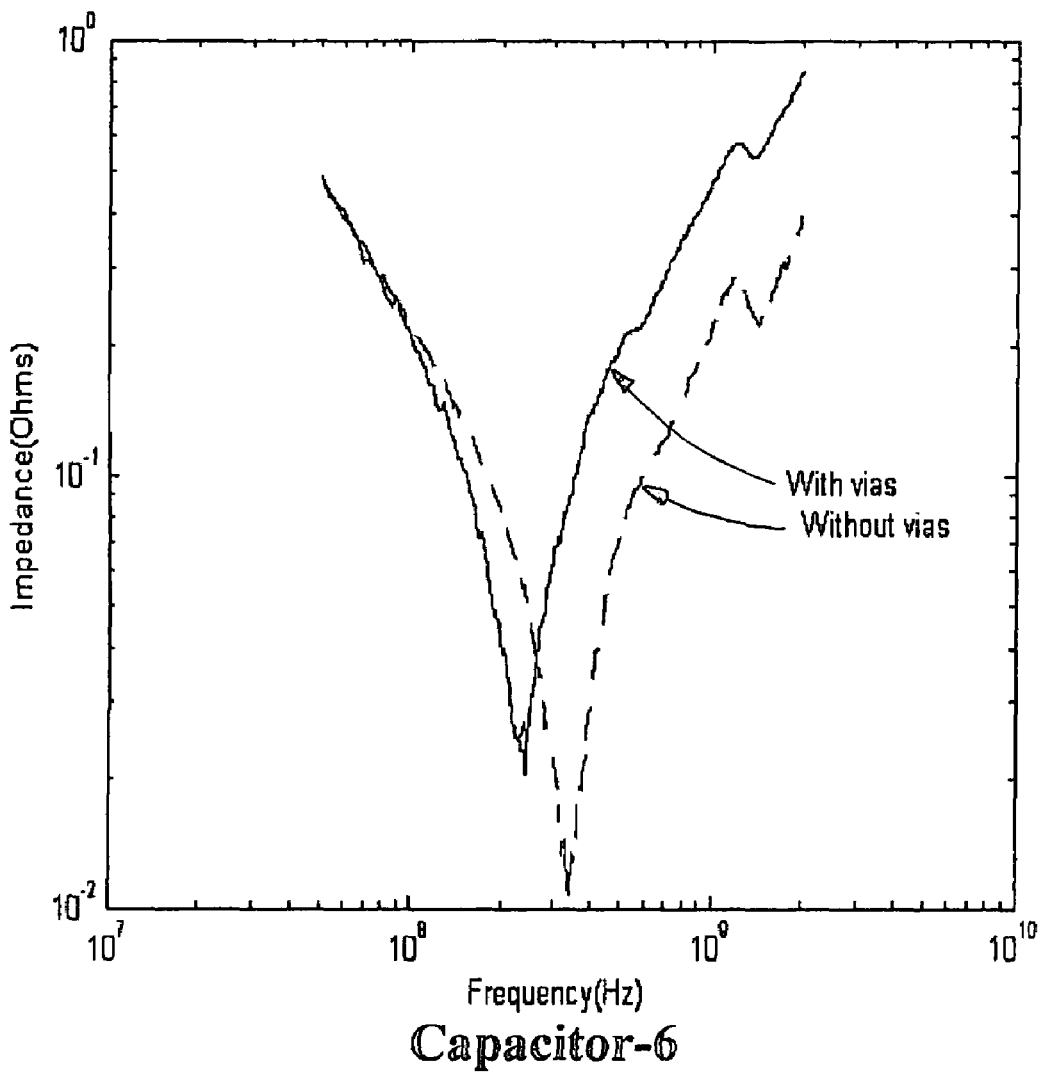

FIG. 9 shows an example of the impedance vs frequency response curves for two capacitor types as numbered in FIGS. 7 and 8 with and without via connections. It shows the resonance frequency shift resulting from the via connections.

Figure 10A:
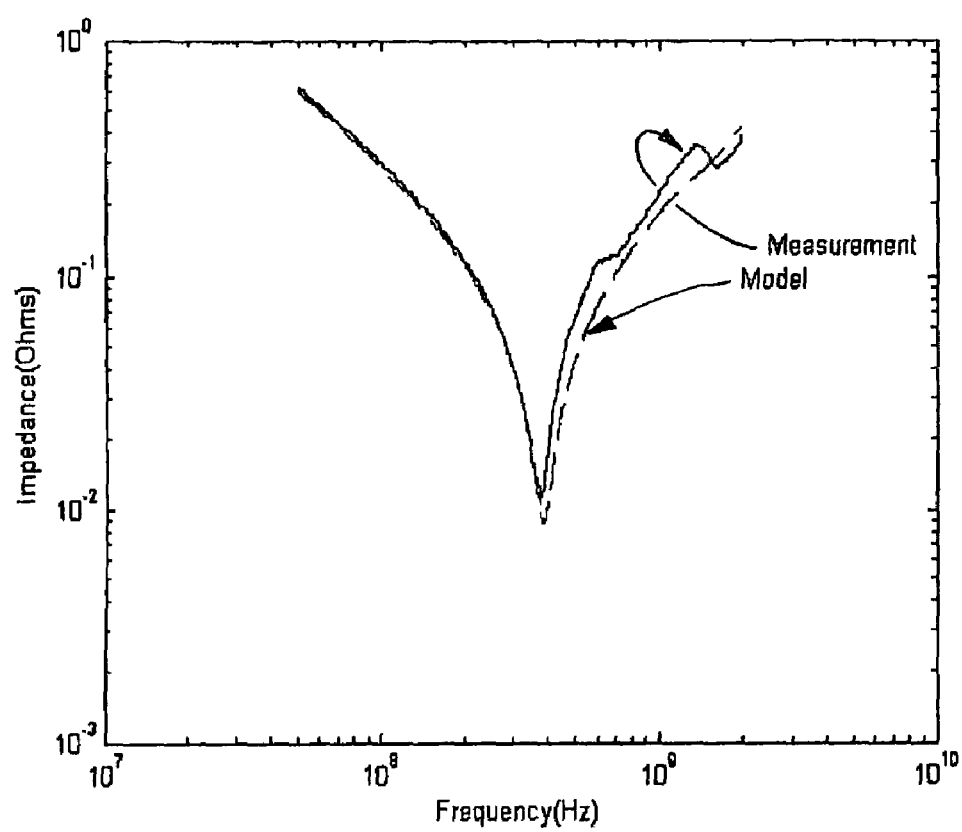
FIGS. 10A and 10B are graphs of model to measurement correlations of capacitors 4A-4C and 7.
Figure 10B:
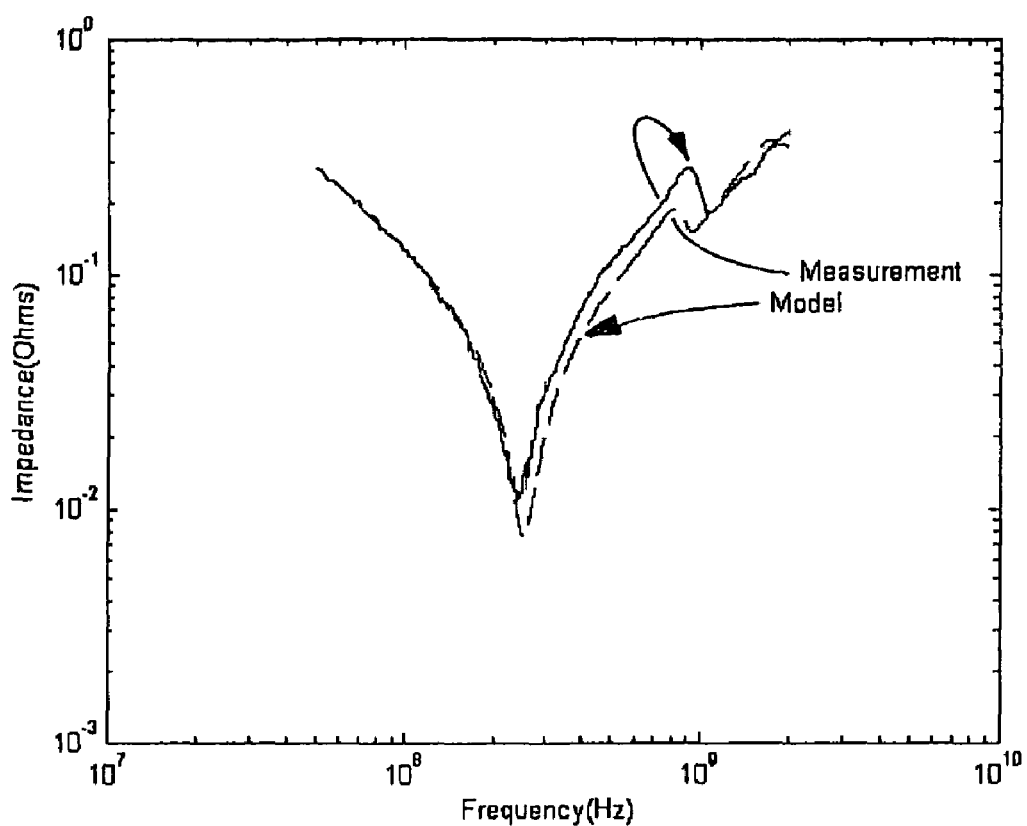

FIG. 10 shows the good correlation between the measured frequency response curves (solid line) and the modelled response curves (dashed line) for two capacitor types of different sizes.

Figure 11B:
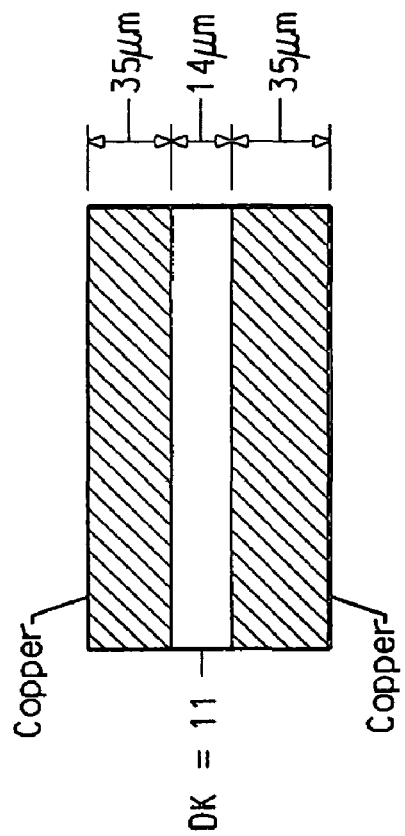
FIGS. 11A and 11B are planar capacitor illustrations.
Figure 11A:
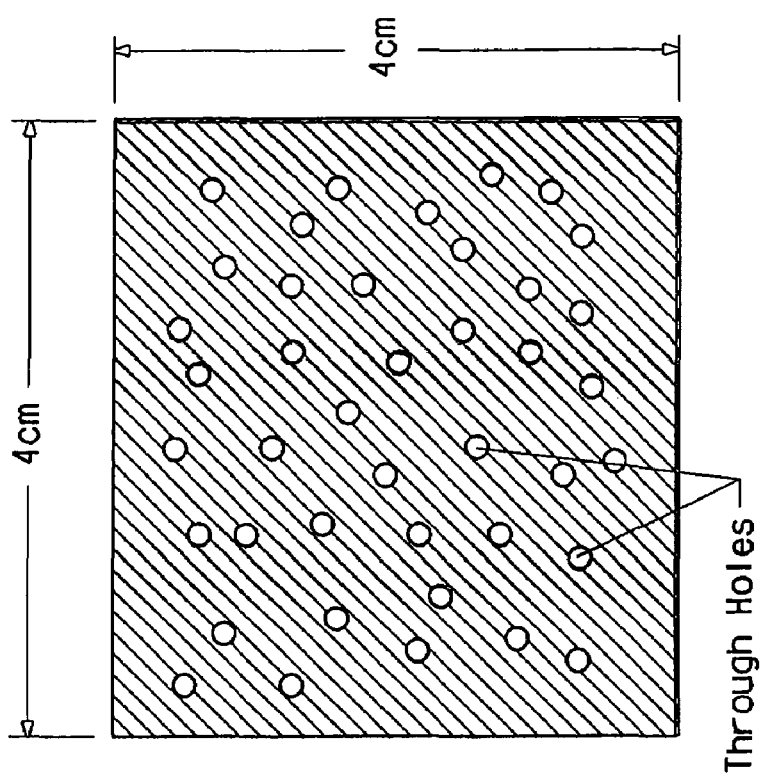

FIG. 11 illustrates the construction of a planar capacitor layer. Through-hole interconnections are indicated in the top-view.

Figure 12:
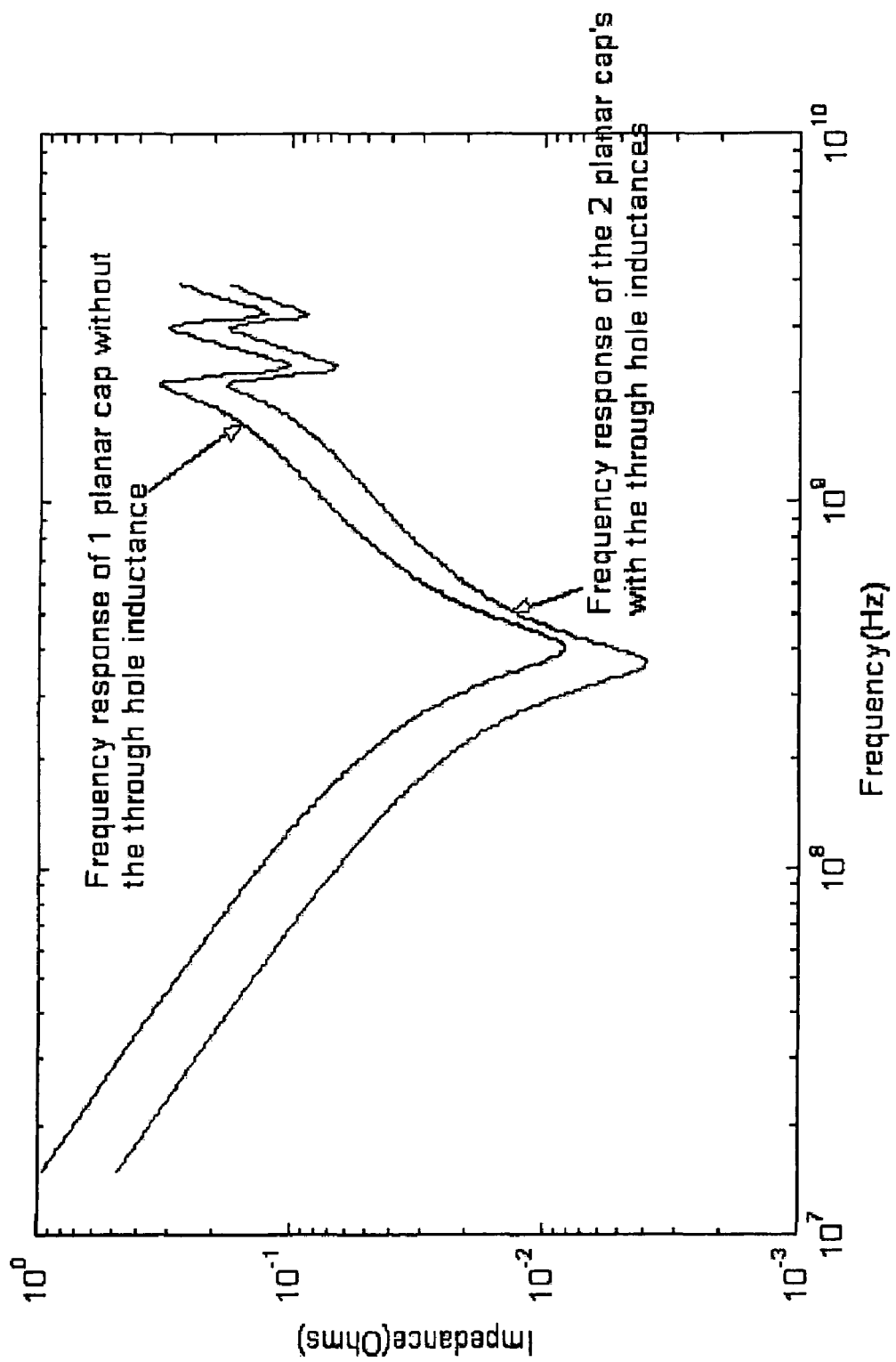
FIG. 12 is a graph modeling planar capacitor frequency response.

FIG. 12 shows the simulation of the planar capacitor impedance vs frequency response curve for the planar capacitor with and without the contribution of the through-hole inductance.

Figure 13:
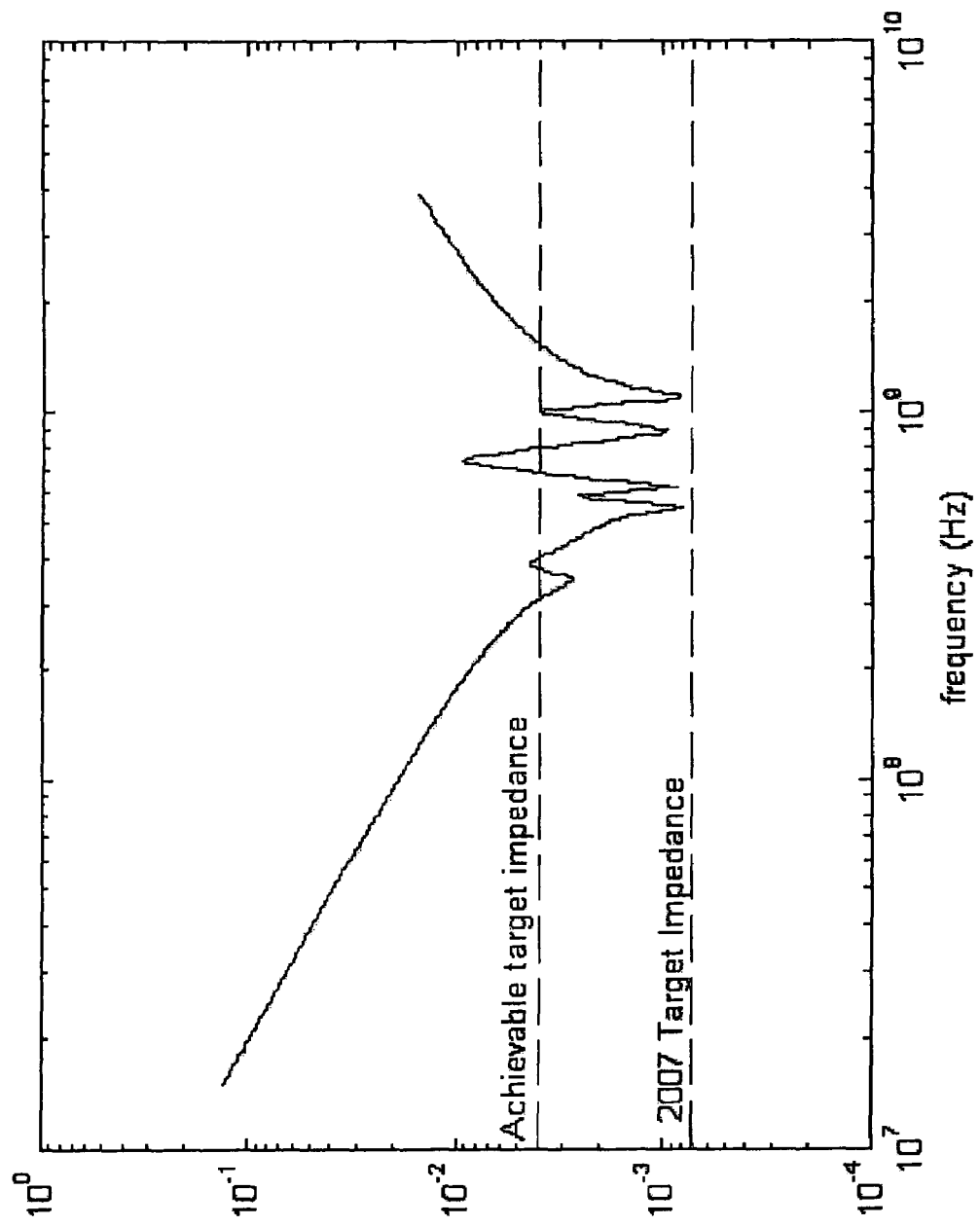
FIG. 13 shows target impedance with a capacitor array.

FIG. 13 shows the modelling result for an array of 64 discrete embedded capacitors applying the conservative design rule of a minimum spacing between capacitors of 500 μm. Capacitors of different sizes and different resonance frequencies were selected so that the capacitor array response curve yields fairly uniform, low impedance values in the mid-frequency range. A horizontal line indicates the achieved impedance in the 100 MHz to 1 GHz range and compares it with the lower impedance requirement of 0.7 mΩ derived from the ITRS roadmap for 2007.

Figure 14:
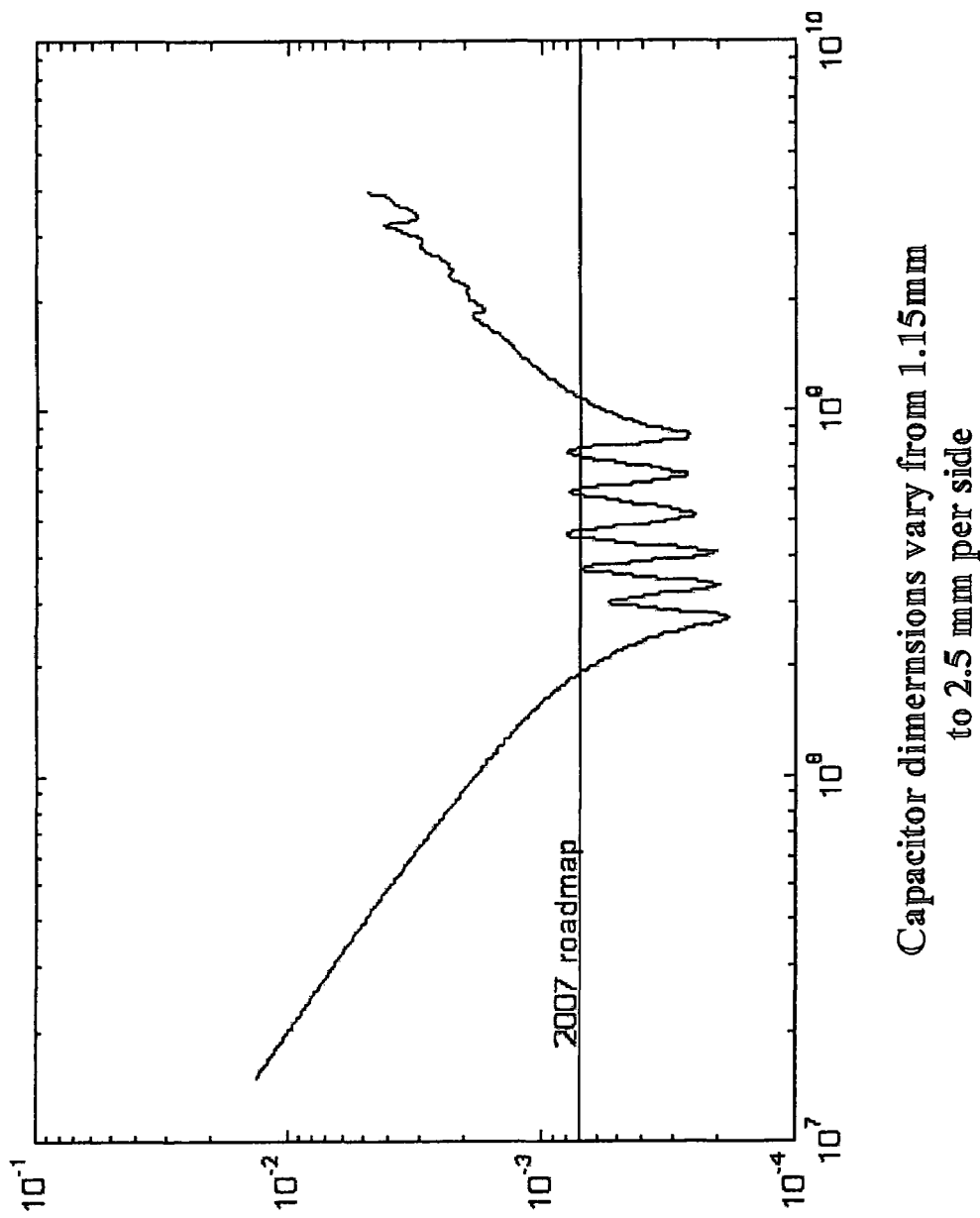
FIG. 14 shows target impedance with varying capacitor sizes.

FIG. 14 shows that by applying more demanding spacing design rules for an array of 1.15 to 2.5 mm$^2$ sized capacitors with optimized electrode area overlap, 2007 target impedance requirements are achieved in the mid-frequency range.

Figure 15A:
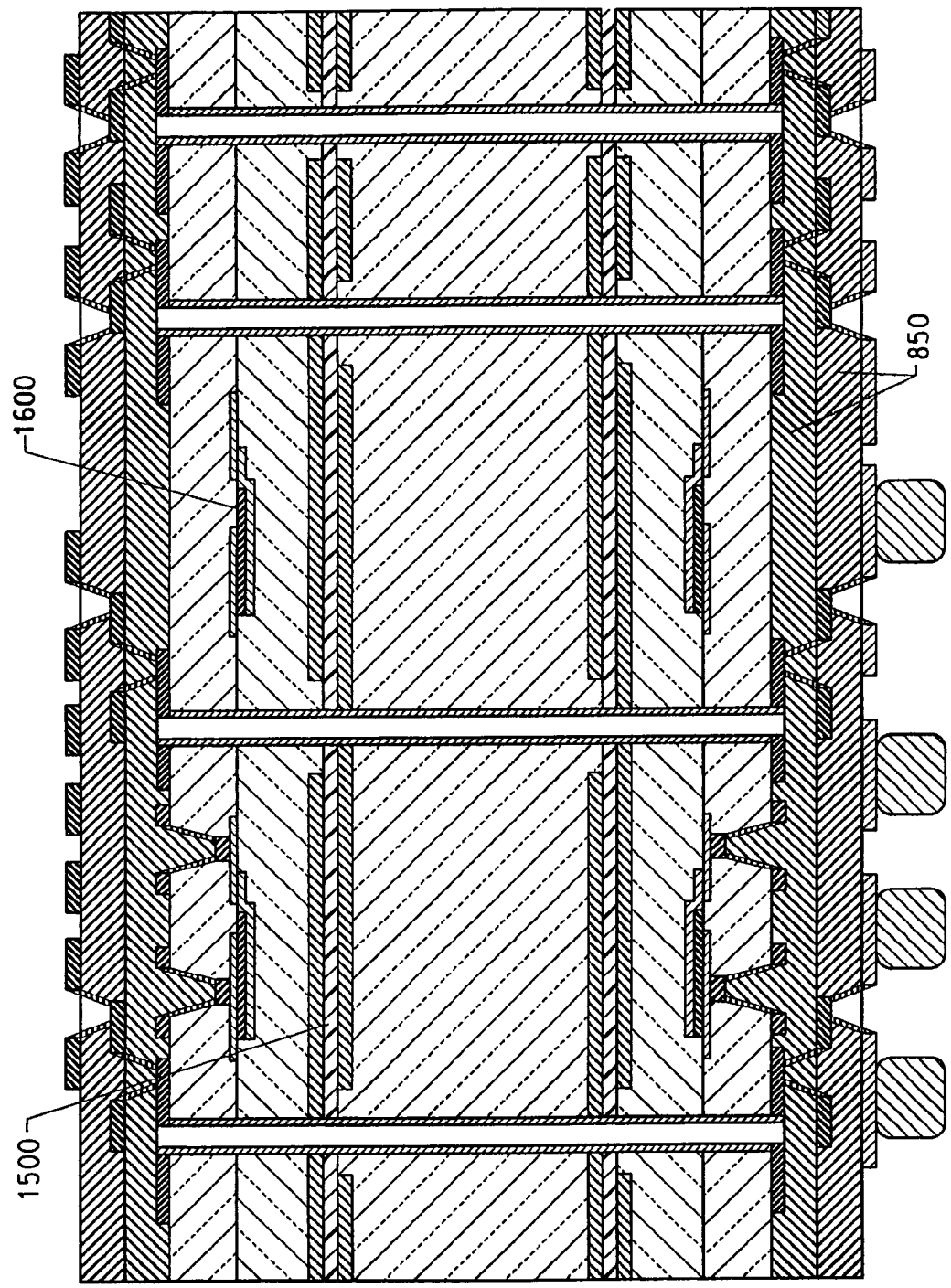
FIG. 15A shows a planar capacitor and a discrete capacitor included in a layer stack-up of a package with an embedded capacitor array.

FIG. 15A depicts a representative package cross section showing the planar capacitor layers [1500], the discrete capacitors [1600] and the microvia layers [850] for interconnections to the discrete and planar capacitors.

Figure 15B:
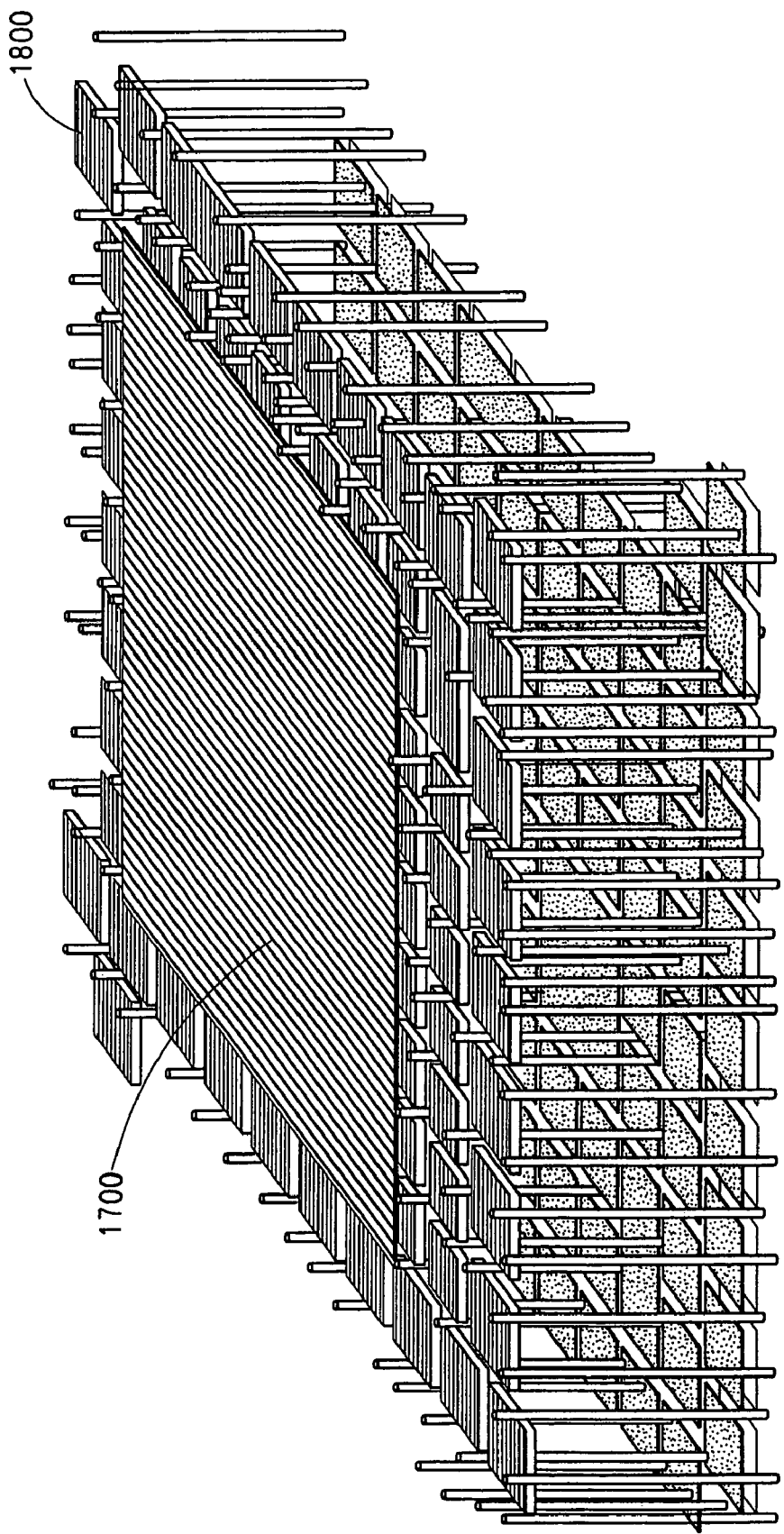
FIG. 15B shows the layout of an embedded capacitor array.

FIG. 15B shows an example of a capacitor array comprised of individual capacitors [1800] of various discrete capacitor sizes arranged in arrays with different locations with respect to the IC [1700] and through hole via connections.

What is claimed is:

1. A device for providing a low noise power supply package to an IC in the mid-frequency range of 1 MHz to 3 GHz comprising installing in said package an array of embedded discrete ceramic capacitors,
   wherein each of the embedded discrete ceramic capacitors in the array has one and only one dielectric with a foil electrode on one side of the dielectric and another electrode on an opposite side of the dielectric, and wherein the embedded discrete ceramic capacitors of the array include capacitors of varying sizes.

2. The device of claim 1 further including at least one planar capacitor layer.

3. The device of claim 1 where the discrete capacitors are fabricated using thin film technology.

4. The device of claim 1 wherein said array of embedded discrete ceramic capacitors is a substantially two dimensional array.

5. The device of claim 1 wherein a plurality of the embedded discrete ceramic capacitors of the array lie in the die shadow of the IC.

6. The device of claim 1 wherein the embedded discrete ceramic capacitors of the array lie in the die shadow of the IC.

7. The device of claim 1 wherein the varying sizes of the embedded discrete ceramic capacitors of the array are in the range of 1 to 9 mm$^2$.

8. The device of claim 1 wherein the array of discrete capacitors is interconnected in parallel and the discrete capacitors of the array are made up of capacitors that have different resonance frequencies in the mid-frequency range.

9. The device of claim 8 wherein the capacitors having different resonance frequencies are of different sizes, shapes, locations and interconnections.

10. The device of claim 8 wherein the discrete ceramic capacitors of the array are arranged in such a way that the capacitor array's impedance vs frequency curve in the critical mid-frequency range yields impedance values at or below a targeted impedance value.

* * * * *

UNITED STATES PATENT AND TRADEMARK OFFICE
CERTIFICATE OF CORRECTION

PATENT NO. : 7,504,706 B2
APPLICATION NO. : 11/514097
DATED : March 17, 2009
INVENTOR(S) : Madhavan Swaminathan et al.

It is certified that error appears in the above-identified patent and that said Letters Patent is hereby corrected as shown below:

Title page

Item [73] Assignee:  change "E. I. Du Pont De Nemours, Wilmington, DE (US)" to --Georgia Tech Research Corporation, Atlanta, GA (US)--

Signed and Sealed this

Seventeenth Day of August, 2010

David J. Kappos
*Director of the United States Patent and Trademark Office*